United States Patent
Kang et al.

(10) Patent No.: US 9,595,687 B2
(45) Date of Patent: Mar. 14, 2017

(54) ORGANIC LIGHT EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Su-Hyoung Kang, Bucheon-si (KR); Hyun Eok Shin, Gwacheon-si (KR); Chang Oh Jeong, Suwon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/741,966

(22) Filed: Jun. 17, 2015

(65) Prior Publication Data
US 2016/0197304 A1 Jul. 7, 2016

(30) Foreign Application Priority Data

Jan. 2, 2015 (KR) .................. 10-2015-0000223

(51) Int. Cl.
*H01L 51/52* (2006.01)
*H01L 27/32* (2006.01)
*H01L 51/56* (2006.01)

(52) U.S. Cl.
CPC ...... *H01L 51/5215* (2013.01); *H01L 27/3248* (2013.01); *H01L 51/5221* (2013.01); *H01L 51/56* (2013.01); *H01L 2227/323* (2013.01); *H01L 2251/301* (2013.01); *H01L 2251/308* (2013.01)

(58) Field of Classification Search
CPC .................................................. H01L 51/5215
See application file for complete search history.

(56) References Cited

U.S. PATENT DOCUMENTS

| 7,948,167 B2* | 5/2011 | Chung ................ H01L 27/3246 313/504 |
| 8,951,083 B2 | 2/2015 | Choi et al. |
| 2008/0128686 A1* | 6/2008 | Kwon ................ H01L 51/5218 257/40 |

(Continued)

FOREIGN PATENT DOCUMENTS

| KR | 10-2004-0066270 A | 7/2004 |
| KR | 10-2013-0127781 A | 11/2013 |

(Continued)

OTHER PUBLICATIONS

Simeon J. Krumbein, "Tutorial: Electrolytic Models For Metallic Electromigration Failure Mechanisms", IEEE Transactions on Reliability, vol. 44, No. 4, Dec. 1995, pp. 539-549.

*Primary Examiner* — Lex Malsawma
(74) *Attorney, Agent, or Firm* — Lee & Morse, P.C.

(57) ABSTRACT

An organic light emitting display device includes a thin film transistor including a semiconductor layer, a gate electrode, and source and drain electrodes, a pixel electrode connected to the thin film transistor, the pixel electrode including a first layer, a second layer disposed on the first layer and including silver, and a third layer including a carbon-based material and covering an upper portion and lateral surface of the second layer, an organic emission layer including an organic light emitting member and disposed on the pixel electrode, and a common electrode disposed on the organic emission layer.

15 Claims, 9 Drawing Sheets

(56) References Cited

U.S. PATENT DOCUMENTS

| | | | |
|---|---|---|---|
| 2008/0218058 A1* | 9/2008 | Son | H01L 51/5218 313/500 |
| 2010/0182523 A1* | 7/2010 | Woo | G02F 1/134363 349/37 |
| 2012/0001206 A1* | 1/2012 | Jeong | H01L 51/5215 257/89 |
| 2012/0104420 A1* | 5/2012 | Lee | H01L 27/3276 257/88 |
| 2012/0248465 A1* | 10/2012 | Choi | H01L 27/3246 257/88 |
| 2014/0061059 A1 | 3/2014 | Dryfe et al. | |
| 2014/0061912 A1 | 3/2014 | De Heer | |
| 2014/0065359 A1 | 3/2014 | Udapi Roa Kulkarni et al. | |
| 2014/0353669 A1* | 12/2014 | Seo | H01L 27/124 257/72 |

FOREIGN PATENT DOCUMENTS

| | | |
|---|---|---|
| KR | 10-1366396 B1 | 2/2014 |
| KR | 10-2014-0040919 A | 4/2014 |

\* cited by examiner

ORGANIC LIGHT EMITTING DISPLAY DEVICE AND METHOD OF MANUFACTURING THE SAME

CROSS-REFERENCE TO RELATED APPLICATION

Korean Patent Application No. 10-2015-0000223, filed on Jan. 2, 2015, in the Korean Intellectual Property Office, and entitled: "Organic Light Emitting Display Device and Method Of Manufacturing The Same," is incorporated by reference herein in its entirety.

BACKGROUND

1. Field

Embodiments relate to an organic light emitting display device and a method of manufacturing the same.

2. Description of the Related Art

Recently, lightweight and thin monitors, televisions, and the like have been required, and accordingly, a cathode ray tube (CRT) has been replaced with a liquid crystal display (LCD). However, a liquid crystal display is a light receiving and emitting device and uses a separate backlight, and may not be ideal in terms of response speed and a viewing angle.

Recently, an organic light emitting display device has attracted much attention as a display device for providing improved characteristics. The organic light emitting display device includes an emission layer disposed between the two electrodes and is configured in such a way that electrons injected from one electrode and holes injected from another electrode are combined in an emission layer to form excitons and the excitons emits light while emitting energy.

Since the organic light emitting display device is a self-emitting type device and does not need a separate light source, the organic light emitting display device has excellent response speed, viewing angle, and contrast ratio and is also excellent in terms of power consumption.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting display device, including a thin film transistor including a semiconductor layer, a gate electrode, and source and drain electrodes, a pixel electrode connected to the thin film transistor, the pixel electrode including a first layer, a second layer disposed on the first layer and including silver, and a third layer including a carbon-based material and covering an upper portion and lateral surface of the second layer, an organic emission layer including an organic light emitting member and disposed on the pixel electrode, and a common electrode disposed on the organic emission layer.

The first layer may include a carbon-based material.

The carbon-based material of the first layer and the third layer may include one or more of carbon nanotubes, carbon nanofibers, carbon black, graphene, fullerene, or graphite.

The first layer may be connected to the drain electrode.

The first layer may include indium tin oxide.

At least one of the source and drain electrodes may include a lower layer including titanium or a carbon-based material, an intermediate layer including aluminum, and an upper layer including a carbon-based material.

The upper layer may cover an upper portion and lateral surface of the intermediate layer.

The carbon-based material may include one or more of carbon nanotubes, carbon nanofibers, carbon black, graphene, fullerene, or graphite.

The intermediate layer may include pure aluminum that is not alloy.

The intermediate layer may include aluminum alloy.

Embodiments are also directed to a method of manufacturing an organic light emitting display device, the method including forming a thin film transistor including a semiconductor layer, a gate electrode, and source and drain electrodes, forming a pixel electrode connected to the thin film transistor and including a first layer, a second layer disposed on the first layer, and a third layer covering upper portions and lateral surfaces of the first layer and the second layer, forming an organic emission layer disposed on the pixel electrode, and forming a common electrode disposed on the organic emission layer.

The first layer and the third layer may include a carbon-based material, and the second layer may include silver.

The carbon-based material of the first layer and the third layer may include carbon nanotubes, carbon nanofibers, carbon black, graphene, fullerene, or graphite.

The first layer may include indium tin oxide, the second layer may include silver, and the third layer may include a carbon-based material.

The carbon-based material of the third layer may include one or more of carbon nanotubes, carbon nanofibers, carbon black, graphene, fullerene, or graphite.

BRIEF DESCRIPTION OF THE DRAWINGS

Features will become apparent to those of skill in the art by describing in detail example embodiments with reference to the attached drawings in which.

DETAILED DESCRIPTION

Figure 1:
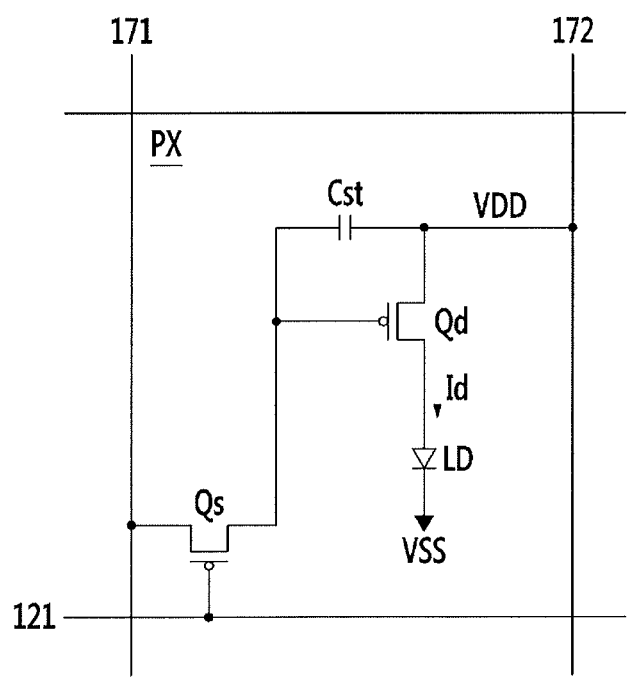
FIG. 1 illustrates a circuit a one-pixel equivalent circuit diagram of an organic light emitting display device according to an example embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting display device according to an example embodiment will be described in detail with reference to the accompanying drawings.

Figure 2:
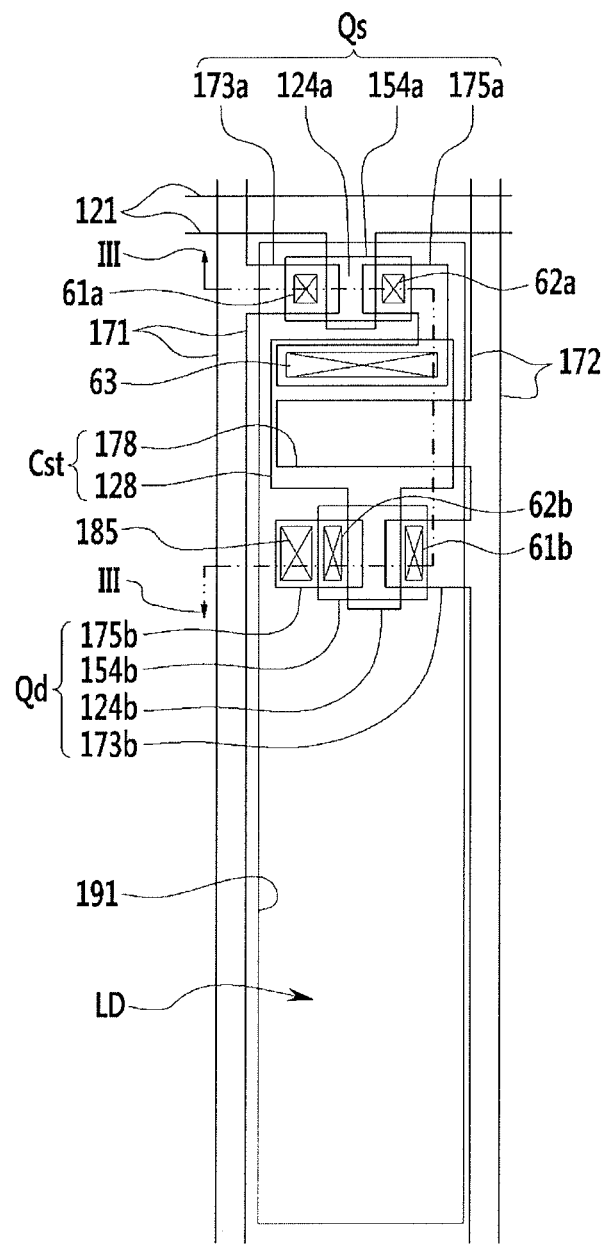
FIG. 2 illustrates a one-pixel layout view of an organic light emitting display device according to an example embodiment.
Figure 3:
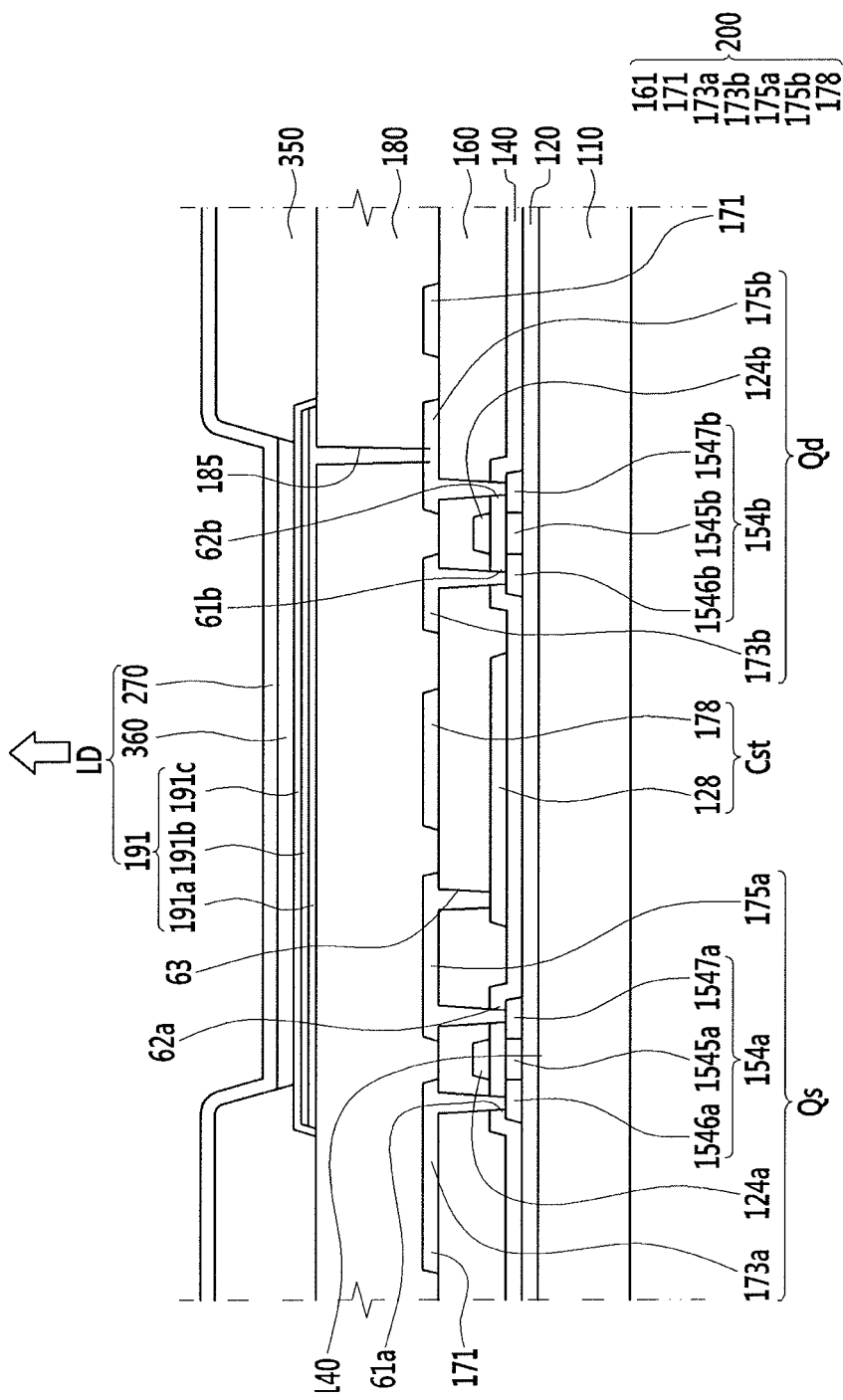
FIG. 3 illustrates a cross-sectional view taken along a line of FIG. 2.

FIG. 1 illustrates a circuit a one-pixel equivalent circuit diagram of an organic light emitting display device according to an example embodiment, FIG. 2 illustrates a one-pixel layout view of an organic light emitting display device according to an example embodiment, and FIG. 3 is a cross-sectional view taken along a line III-III of FIG. 2.

Referring to FIG. 1, the organic light emitting display device according to the present example embodiment includes a plurality of signal lines 121, 171, and 172 and a plurality of pixels PX connected thereto and arranged in the form of approximate matrix.

A signal line includes a plurality of gate lines 121 for transmitting a gate signal (or a scan signal), a plurality of data lines 171 for transmitting a data signal, and a plurality of driving voltage lines 172 for transmitting a driving voltage (ELVDD). The gate signal and the data signal are applied through a display driving driver (not shown).

The gate lines 121 extend in an approximate row direction and are almost disposed in parallel to each other. The data lines 171 and the driving voltage lines 172 extend in an approximate column direction and are almost disposed in parallel to each other.

Each pixel PX includes a switching thin film transistor Qs, a driving thin film transistor Qd, a storage capacitor Cst, and an organic light emitting diode LD.

The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs transmits a data signal applied to the data line 171 to the driving thin film transistor Qd in response to a gate signal applied to the gate line 121.

The driving thin film transistor Qd also includes a control terminal, an input terminal, and an output terminal. The control terminal is connected to the switching thin film transistor Qs, the input terminal is connected to the driving voltage line 172, and the output terminal is connected to the organic light emitting diode LD. The driving thin film transistor Qd flows output current Id, the amount of which is changed according to a voltage between the control terminal and the output terminal.

The storage capacitor Cst is connected between the control terminal and input terminal of the driving thin film transistor Qd. The storage capacitor Cst is charged with a data signal applied to the control terminal of the driving thin film transistor Qd and also maintains the data signal after the switching thin film transistor Qs is turned off.

The organic light emitting diode LD includes an anode connected to the output terminal of the driving thin film transistor Qd and a cathode connected to a common voltage VSS. The organic light emitting diode LD displays an image by emitting light with intensity that is varied according to the output current Id of the driving thin film transistor Qd.

The switching thin film transistor Qs and the driving thin film transistor Qd may be an n-channel electric field effect transistor (FET) or a p-channel electric field effect transistor. In addition, connection correlations of the switching and the driving thin film transistors Qs and Qd, and the storage capacitor Cst, and the organic light emitting diode LD may be changed.

Referring to FIG. 2 and FIG. 3, the light emitting display device according to an example embodiment is configured in such a way that a thin film display layer 200 is disposed on a display substrate 110.

The thin film display layer 200 includes a buffer layer 120, switching and driving semiconductor layers 154a and 154b, a gate insulating layer 140, a gate line 121, a first storage capacitor plate 128, an interlayer insulating layer 160, a data line 171, a driving voltage line 172, a switching drain electrode 175a, a driving drain electrode 175b, and a passivation layer 180.

The buffer layer 120 may be disposed on the display substrate 110 formed of transparent glass, etc. and formed as a single layer of silicon nitride (SiNx), or a bilayer structure in which silicon nitride (SiNx) and silicon oxide ($SiO_2$) are stacked. The buffer layer 120 may prevent undesirable contaminants, such as impurities or moisture, from penetrating, and may simultaneously smoothen a surface.

The switching semiconductor layer 154a and the driving semiconductor layer 154b are spaced apart from each other on the buffer layer 120. The switching semiconductor layer 154a and the driving semiconductor layer 154b are formed of polycrystalline silicon, and include channel regions 1545a and 1545b, source regions 1546a and 1546b, and drain regions 1547a and 1547b. The source regions 1546a and 1546b and the drain regions 1547a and 1547b are disposed next to opposite sides of the channel regions 1545a and 1545b, respectively.

The channel regions 1545a and 1545b are formed of polysilicon that is not doped with impurity, i.e., is an intrinsic semiconductor, and the source regions 1546a and 1546b and the drain regions 1547a and 1547b are formed of polysilicon that is doped with conductive impurity, i.e., is an impurity semiconductor.

The gate insulating layer 140 is disposed on the channel regions 1545a and 1545b of the switching semiconductor layer 154a and the driving semiconductor layer 154b. The gate insulating layer 140 may be a single layer or multiple layers including at least one of silicon nitride and silicon oxide.

The gate line 121 is disposed on the gate insulating layer 140 and the first storage capacitor plate 128 is disposed on the buffer layer 120.

The gate line 121 extends in a horizontal direction, transmits a gate signal, and includes a switching gate electrode 124a that protrudes toward the switching semiconductor layer 154a from the gate line 121.

The first storage capacitor plate 128 includes a driving gate electrode 124b that protrudes toward the driving semiconductor layer 154b from the first storage capacitor plate 128. The switching gate electrode 124a and the driving gate electrode 124b overlap with the channel regions 1545a and 1545b, respectively.

The interlayer insulating layer 160 is disposed on the gate line 121, the first storage capacitor plate 128, and the buffer layer 120.

A switching source contact hole 61a and a switching drain contact hole 62a that expose the source region 1546a and drain region 1547a of the switching semiconductor layer 154a therethrough, respectively, are formed in the interlayer insulating layer 160. In addition, a driving source contact hole 61b and a driving drain contact hole 62b that expose the source region 1546b and drain region 1547b of the driving semiconductor layer 154b therethrough, respectively, are formed in the interlayer insulating layer 160.

The data line 171, the driving voltage line 172, the switching drain electrode 175a, and the driving drain electrode 175b are disposed on the interlayer insulating layer 160.

The data line 171 transmits a data signal, extends in a direction in which the data line 171 and the gate line 121 cross each other and includes a switching source electrode 173a that protrudes toward the switching semiconductor layer 154a from the data line 171.

The driving voltage line 172 transmits a driving voltage, is separated from the data line 171, and extends in the same direction as the data line 171. The driving voltage line 172 includes a second storage capacitor plate 178 that overlaps with a driving source electrode 173b that protrudes toward the driving semiconductor layer 154b from the driving voltage line 172 and the first storage capacitor plate 128 that protrudes from the driving voltage line 172. Here, the first storage capacitor plate 128 and the second storage capacitor plate 178 constitute a storage capacitor Cst using the interlayer insulating layer 160 as a dielectric material.

The switching drain electrode 175a faces the switching source electrode 173a and the driving drain electrode 175b faces the driving source electrode 173b.

The switching source electrode 173a and the switching drain electrode 175a are connected to the source region 1546a and the drain region 1547a of the switching semiconductor layer 154a through the switching source contact hole 61a and the switching drain contact hole 62a, respectively. In addition, the switching drain electrode 175a extends and is electrically connected to the first storage capacitor plate 128 and the driving gate electrode 124b through the first contact hole 63 formed in the interlayer insulating layer 160.

The driving source electrode 173b and the driving drain electrode 175b are electrically connected to the source region 1546b and the drain region 1547b of the driving semiconductor layer 154b through the driving source contact hole 61b and the driving drain contact hole 62b, respectively.

The switching semiconductor layer 154a, the switching gate electrode 124a, the switching source electrode 173a, and the switching drain electrode 175a constitute a switching thin film transistor Qs, and the driving semiconductor layer 154b, the driving gate electrode 124b, the driving source electrode 173b, and the driving drain electrode 175b constitute the driving thin film transistor Qd.

The passivation layer 180 is formed on the data line 171, the driving voltage line 172, the switching drain electrode 175a, and the driving drain electrode 175b.

A second contact hole 185 through which the driving drain electrode 175b is exposed is formed in the passivation layer 180.

An organic light emitting diode LD and a pixel definition layer 350 are disposed on the passivation layer 180.

The organic light emitting diode LD includes a pixel electrode 191, an organic emission layer 360, and a common electrode 270.

The pixel electrode 191 is disposed on the passivation layer 180 and is electrically connected to the driving drain electrode 175b of the driving thin film transistor Qd through the second contact hole 185 formed in the interlayer insulating layer 160. The pixel electrode 191 may be an anode of the organic light emitting diode LD.

In the present example embodiment, the pixel electrode 191 may be formed as a triple layer in which a first layer 191a, a second layer 191b, and a third layer 191c are sequentially stacked. The pixel electrode 191 may be electrically conductive, with an electrical path being formed through each of the first layer 191a, the second layer 191b, and the third layer 191c.

The first layer 191a may be formed of a transparent conductive material such as a carbon-based material or indium tin oxide (ITO), indium zinc oxide (IZO), or the like. The first layer 191a is electrically connected to the driving drain electrode 175b of the driving thin film transistor Qd through the second contact hole 185 formed in the interlayer insulating layer 160. The first layer 191a may directly contact the driving drain electrode 175b of the driving thin film transistor Qd through the second contact hole 185 formed in the interlayer insulating layer 160.

The second layer 191b may be positioned on the first layer 191a and may include silver (Ag).

The third layer 191c may be positioned on the second layer 191b and may include a carbon-based material.

The carbon-based material of the first layer 191a and/or the third layer 191c may include one or more of, for example, carbon nanotubes (CNT), carbon nanofibers (CNF), carbon black, graphene, fullerene, or graphite.

In addition, the third layer 191c may be formed on a lateral surface of the second layer 191b as well as an upper portion of the second layer 191b so as to be formed to completely cover the second layer 191b.

According to the present example embodiment, the second layer 191b of the pixel electrode 191 may include silver (Ag). In this regard, the organic light emitting display device according to the present example embodiment is configured in such a way that the third layer 191c of the pixel electrode 191 is formed of a carbon-based material that is easily reduced instead of silver (Ag) and the second layer 191b is completely covered by the third layer 191c. Thus, dark spots from elution of silver (Ag) may be reduced or eliminated.

The pixel definition layer 350 is disposed on an edge portion of the pixel electrode 191 and the passivation layer 180.

The pixel definition layer 350 has an opening through which the pixel electrode 191 is exposed. The pixel definition layer 350 may be formed of a resin such as polyacrylates, polyimides, or the like.

The organic emission layer 360 is disposed on the pixel electrode 191 in the opening of the pixel definition layer 350. The organic emission layer 360 may be disposed as a plurality of organic light emitting members, and may include one or more of an emission layer, a hole-injection layer (HIL), a hole-transporting layer (HTL), an electron-transporting layer (ETL), and an electron-injection layer (EIL). When the organic emission layer 360 includes all of them, the hole-injection layer may be positioned on the pixel electrode 191 as an anode, and the hole-transporting layer, the emission layer, the electron-transporting layer, and the electron-injection layer may be sequentially stacked on the hole-injection layer.

The organic emission layer 360 may include a red organic emission layer for emitting red light, a green organic emission layer for emitting green light, and a blue organic emission layer for emitting blue light, and the red organic emission layer, the green organic emission layer, and the blue organic emission layer are formed in a red pixel, a green pixel, and a blue pixel, respectively so as to realize a color image.

In another implementation, the organic emission layer 360 may be configured in such a way that all of the red organic emission layer, the green organic emission layer, and the blue organic emission layer are stacked in the red pixel, the green pixel, and the blue pixel, and a red color filter, a green color filter, and a blue color filter are formed in the respective pixels so as to realize a color image. As another example, a white organic emission layer for emitting white light is formed on all of the red pixel, the green pixel, and the blue pixel, and the red color filter, the green color filter, and the blue color filter are formed in the respective pixels so as to realize a color image. When the color image is realized using the white organic emission layer and the color filter, a deposition mask for deposition of the red organic emission layer, the green organic emission layer, and the blue organic emission layer on the respective pixels, that is, respective red, green, and blue pixels, may not be used.

Also, the white organic emission layer described as another example may be formed as one organic emission layer, or may also be configured so as to stack a plurality of organic emission layers to emit white light. For example, the white organic emission layer may also be configured so as to combine at least one yellow organic emission layer and at least one blue organic emission layer to emit white light, to combine at least one cyan organic emission layer and at least one red organic emission layer to emit white light, and to combine at least one magenta organic emission layer and at least one green organic emission layer to realize white light.

The common electrode 270 is disposed on the pixel definition layer 350 and the organic emission layer 360. The common electrode 270 may be formed of a transparent conductive material such as ITO, IZO, ZnO, $In_2O_3$, or the like, or reflective material such as lithium, calcium, fluoride lithium/calcium, fluoride lithium/aluminum, aluminum, silver, magnesium, gold, or the like. The common electrode 270 is a cathode of the organic light emitting diode LD.

Figure 4:
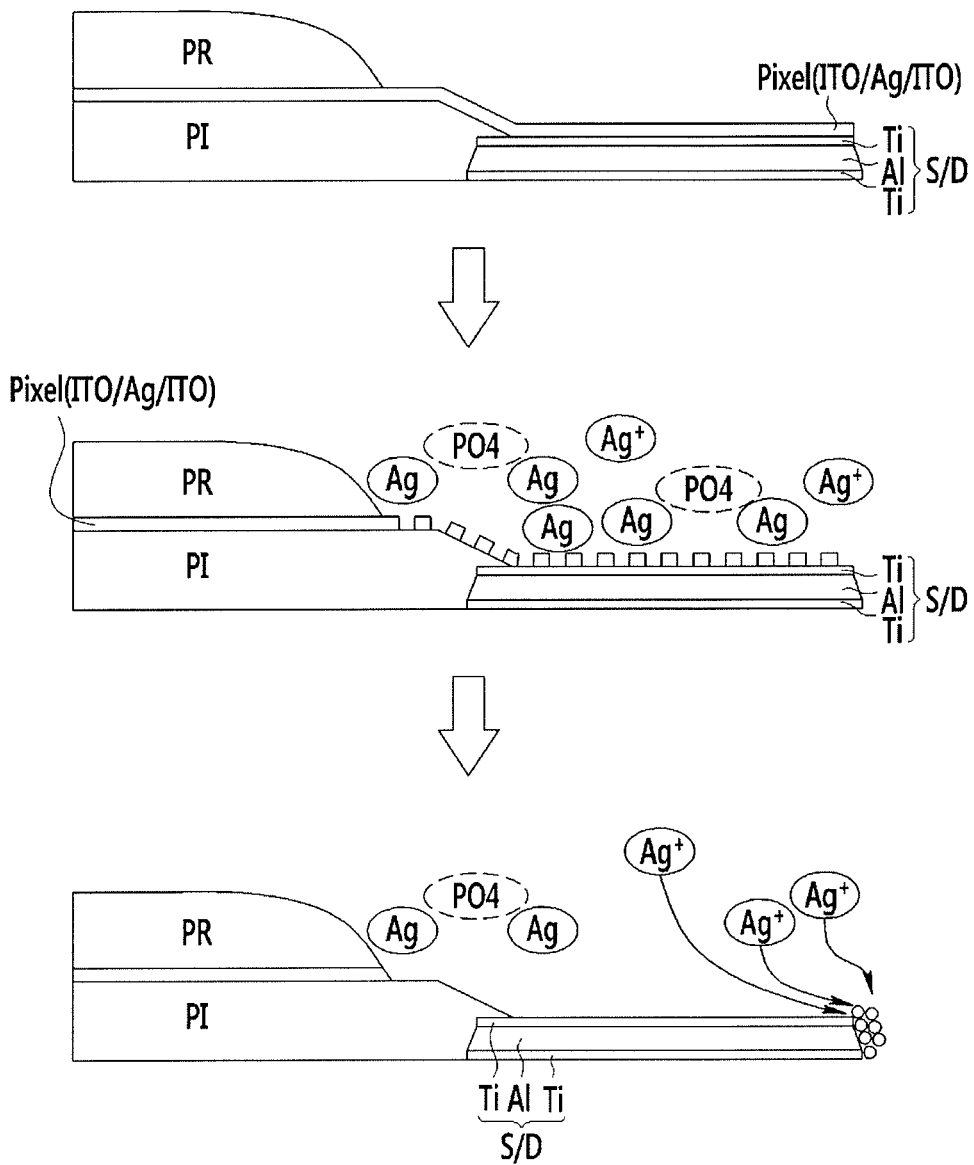
FIG. 4 illustrates a drawing for explanation of a phenomenon of reducing and eluting silver (Ag) of a pixel electrode according to a Comparative Example.
Figure 5:
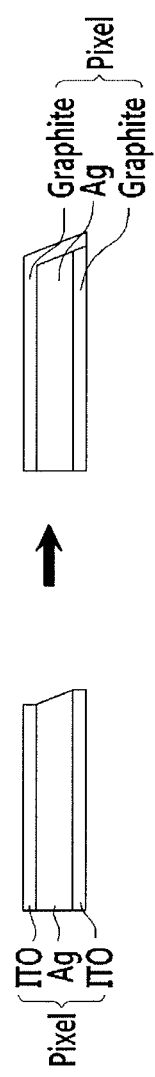
FIG. 5 illustrates a cross-sectional view of a pixel electrode according to a Comparative Example and a pixel electrode according to an example embodiment.
Figure 6:
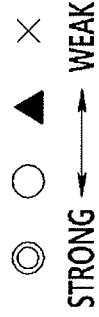
FIG. 6 illustrates a drawing for comparison of characteristics between a pixel electrode according to a Comparative Example and a pixel electrode according to an example embodiment.

With reference to FIGS. 4, 5, and 6, a pixel electrode and an effect thereof will be described according to an example embodiment.

FIG. 4 illustrates a drawing for explanation of a phenomenon of silver (Ag) elution and reduction in a pixel electrode according to a Comparative Example, FIG. 5 illustrates a cross-sectional view of a pixel electrode according to a Comparative Example and a pixel electrode according to an example embodiment, and FIG. 6 illustrates a drawing for comparison of characteristics between a pixel electrode according to a Comparative Example and a pixel electrode according to an example embodiment.

Referring to FIG. 4, the pixel electrode according to a Comparative Example is formed as a triple layer of ITO/Ag/ITO and source and drain electrodes are formed as a triple layer of Ti/Al/Ti. With regard to the pixel electrode Pixel, the triple layer of ITO/Ag/ITO is illustrated as one layer.

During formation of patterns of the pixel electrode Pixel, an etchant including phosphoric acid ($H_3PO_4$) is used. In this case, silver ion (Ag+) of the pixel electrode Pixel is generated by phosphoric acid ($H_3PO_4$) of the etchant.

Silver (Ag) included in the pixel electrode is easily reduced compared with aluminum Al included in the source and drain electrodes. That is, silver (Ag) is reduced and aluminum (Al) is oxidized, and thus problems arise in that silver ion Ag+ are stuck to the source and drain electrodes and are reduced to silver (Ag) particles to generate dark spots.

Referring to FIG. 5, instead of a triple layer of ITO/Ag/ITO (left side of FIG. 5), the pixel electrode according to an example embodiment (right side of FIG. 5) may be formed as a triple layer including the first layer/second layer/third layer. Particularly, the first layer and the third layer may be formed of a carbon-based material and the second layer may be formed of silver (Ag). In this case, the carbon-based material may be formed of one or more of carbon nanotubes (CNT), carbon nanofibers (CNF), carbon black, graphene, fullerene, or graphite.

In addition, the third layer may be formed to cover a lateral surface (see the rightmost edge of the pixel electrode) as well as an upper portion of the second layer including silver (Ag), so as to prevent silver (Ag) from being changed to silver ion (Ag+) by phosphoric acid ($H_3PO_4$) of the etchant.

Referring to FIG. 6, the pixel electrode according to a Comparative Example includes a third layer formed of ITO on the second layer including silver (Ag), whereas the pixel electrode according to an example embodiment includes a third layer including graphene on a second layer including silver (Ag). It may be seen that, compared with the case in which the third layer is formed of ITO, when the third layer is formed of graphene, excellent conductivity and flexible bending are achieved, and silver (Ag) is prevented from being reduced to generate dark spots.

Hereinafter, repetition of materials and configurations of respective components will be omitted.

Figure 7:
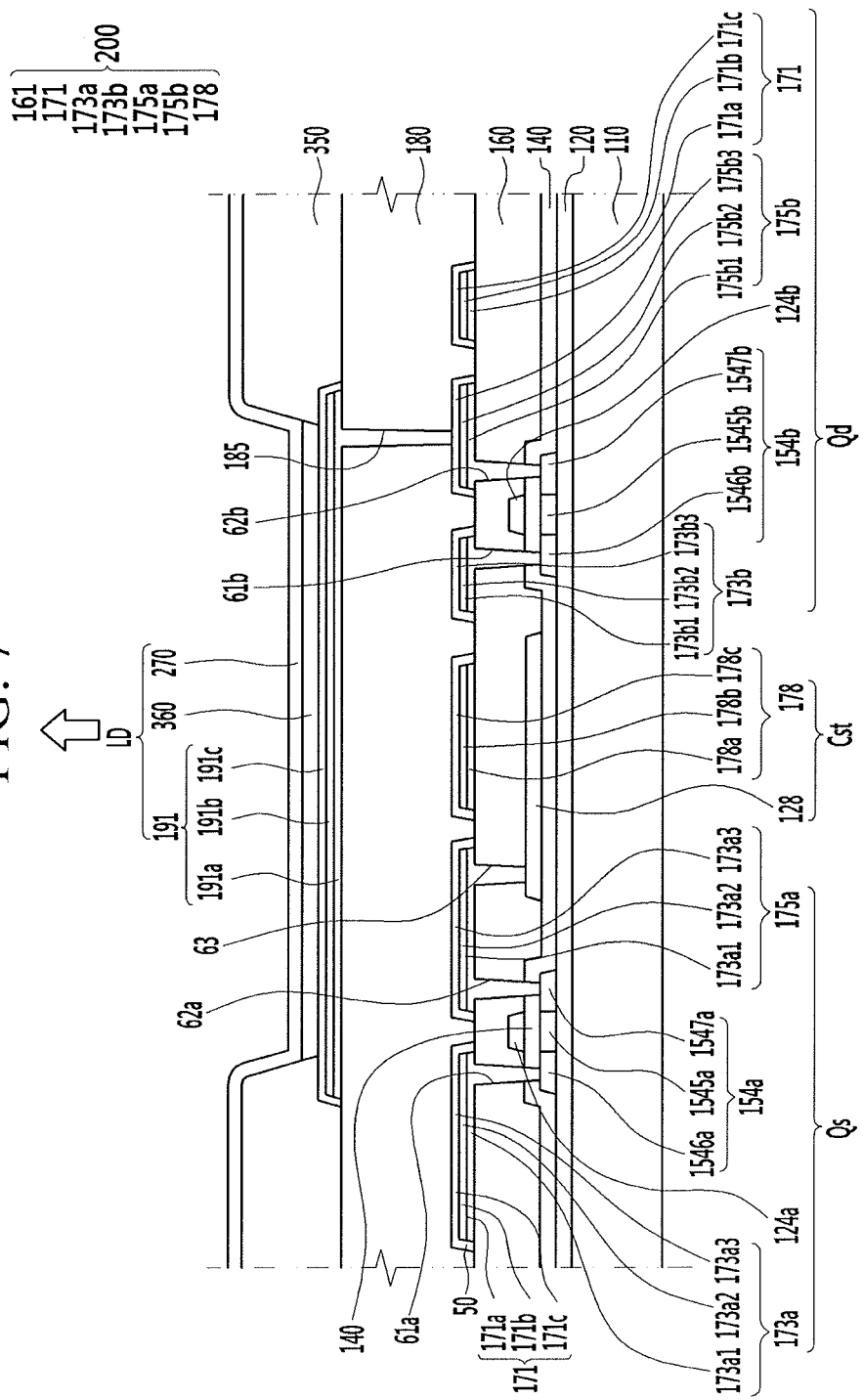
FIG. 7 illustrates a one-pixel cross-sectional view of an organic light emitting display device according to another example embodiment.
Figure 8:
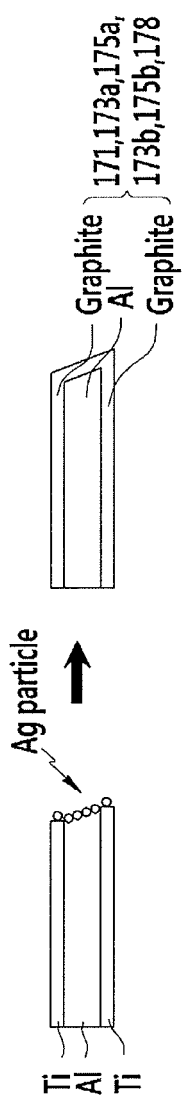
FIG. 8 illustrates a cross-sectional view of source and drain electrodes of a pixel cross-sectional view according to another example embodiment.

FIG. 7 illustrates a one-pixel cross-sectional view of an organic light emitting display device according to another example embodiment, and is the same as the one-pixel cross-sectional view of the organic light emitting display device of FIG. 3 except that structures of the source electrode 173a and 173b, the drain electrode 175a and 175b, and the second storage capacitor plate 178 are changed. FIG. 8 is a cross-sectional view of source and drain electrodes of a pixel cross-sectional view according to another example embodiment. Thus, the same reference numeral is denoted for the same component, and a detailed description thereof will be omitted.

Referring to FIG. 7, the organic light emitting display device according to another example embodiment is configured in such a way that the thin film display layer 200 is disposed on the display substrate 110.

The thin film display layer 200 includes the interlayer insulating layer 160, the data line 171, the switching source electrode 173a, the switching drain electrode 175a, the driving source electrode 173b, the driving drain electrode 175b, and the storage capacitor plate 178.

The data line 171, the switching source electrode 173a, the switching drain electrode 175a, the driving source electrode 173b, the driving drain electrode 175b, and the storage capacitor plate 178 may be formed as a triple layer including a lower layer/intermediate layer/upper layer on the interlayer insulating layer 160.

Lower layers 171a, 173a1, 175a1, 173b1, 175b1, and 178a may include Ti or a carbon-based material, intermediate layers 171b, 173a2, 175a2, 173b2, 175b2, and 178b may include aluminum (Al), and upper layers 171c, 173a3, 175a3, 173b3, 175b3, and 178c may include a carbon-based material.

In this case, the carbon-based material may include one or more of carbon nanotubes (CNT), carbon nanofibers (CNF), carbon black, graphene, fullerene, or graphite.

The upper layers 171c, 173a3, 175a3, 173b3, 175b3, and 178c including a carbon-based material may be formed to cover lateral surfaces and upper portions of the intermediate layers 171b, 173a2, 175a2, 173b2, 175b2, and 178b including aluminum (Al) so as to prevent silver ion (Ag+) from being stuck to the data line 171, the switching source electrode 173a, the switching drain electrode 175a, the driving source electrode 173b, the driving drain electrode 175b, and the storage capacitor plate 178 to be reduced to silver (Ag) particles and to generate dark spots.

In addition, the intermediate layers 171b, 173a2, 175a2, 173b2, 175b2, and 178b may be formed of pure aluminum that is not alloy or aluminum alloy.

In this case, when the intermediate layers 171b, 173a2, 175a2, 173b2, 175b2, and 178b are formed of aluminum alloy, the intermediate layers 171b, 173a2, 175a2, 173b2, 175b2, and 178b may be more stable at high temperature compared with the case of pure aluminum that is not alloy. Aluminum alloy may be an alloy including aluminum (Al) and neodymium (Nd). In this case, Al—Nd alloy may contain about 95-98 at. % of Al and 2-5 at. % of Nd.

Figure 9:
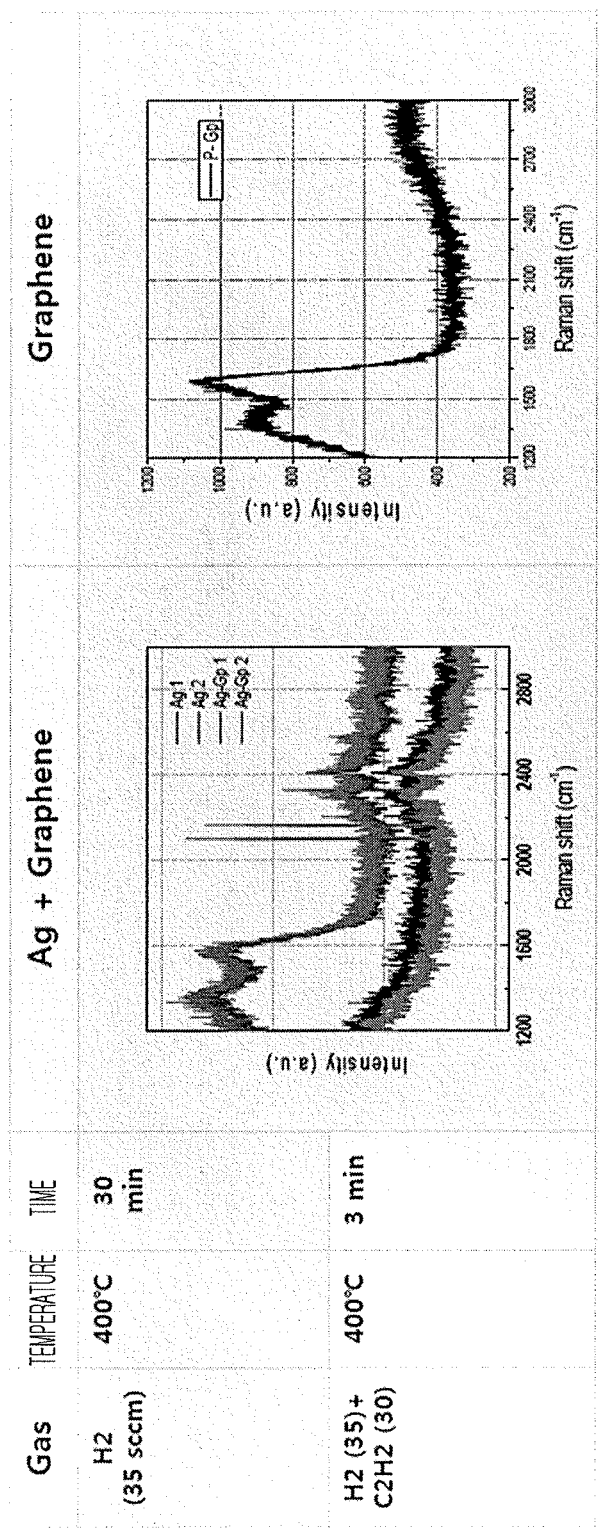
FIG. 9 illustrates a drawing showing the case in which graphene is formed on silver (Ag).

FIG. 9 illustrates a drawing showing the case in which graphene is formed on silver (Ag) and shows intensity according to Raman Shift when graphene is formed on silver (Ag) using hydrogen ($H_2$) gas at a temperature of 400° C. for a predetermined time period.

As seen from FIG. 9, a peak point of intensity according to Raman Shift is also present in pure silver (Ag) when graphene is formed on silver Ag. This shows that graphene is well formed on silver (Ag).

That is, the pixel electrode of the organic light emitting display device according to an example embodiment may be formed of graphene/silver (Ag)/graphene and the pixel electrode may be formed of graphene/silver (Ag)/graphene so as to originally prevent silver ion (Ag+) of the pixel electrode Pixel from being generated by phosphoric acid ($H_3PO_4$) of etchant.

Hereinafter, a method of manufacturing the organic light emitting display device of FIG. 3 will be described briefly.

Referring to FIG. 3, the method of manufacturing the organic light emitting display device according to an example embodiment includes forming thin film transistors Qs and Qd including the semiconductor layers 154a and 154b, the gate electrodes 124a and 175b, and the source and drain electrodes 173a, 173b, 175a, and 175b, forming a pixel electrode 191 connected to the thin film transistors Qs and Qd and including a first layer 191a, a second layer 191b positioned on the first layer 191a, and a third layer 191c that covers upper portions and lateral surfaces of the first layer 191a and the second layer 191b, forming the organic emission layer 360 disposed on the pixel electrode 191, and forming the common electrode 270 disposed on the organic emission layer 360.

The forming of the thin film transistors Qs and Qd, the forming of the organic emission layer 360, and the forming of the common electrode 270 are the same as known technologies, and thus a detailed description thereof will be omitted.

In the forming of the pixel electrode 191, the first layer 191a and the second layer 191b are stacked and patterned and the third layer 191c is formed to cover upper portions and lateral surfaces of the first layer 191a and the second layer 191b.

In this case, the first layer 191a may be formed of indium tin oxide (ITO) or a carbon-based material, the second layer 191b may be formed of silver (Ag), and the third layer 191c may be formed of a carbon-based material.

The carbon-based material may be formed of one or more materials selected from carbon nanotubes (CNT), carbon nanofibers (CNF), carbon black, graphene, fullerene, and graphite.

As described above, embodiments may provide an organic light emitting display device, and a method of manufacturing the same, wherein silver (Ag) included in a pixel electrode is prevented from being eluted to cause dark spots. According to embodiments, a pixel electrode may be formed of ITO or a triple layer in which carbon-based material/silver (Ag)/carbon-based material are stacked, and the carbon-based material may be formed to cover an upper portion and lateral surface of silver (Ag) so as to prevent silver (Ag) from being changed to silver ion (Ag+) by phosphoric acid ($H_3PO_4$) of an etchant, to prevent dark spots.

According to the present example embodiment, source and drain electrodes may be formed of Ti or a triple layer in which carbon-based material/aluminum (Al)/carbon-based material are stacked and the carbon-based material may be formed to cover an upper portion and lateral surface of aluminum (Al) so as to prevent silver ion (Ag+) from being stuck to the source and drain electrodes to be reduced, thereby preventing errors of dark spots.

<Description of symbols>

110: display substrate 120: buffer layer
121: gate line 124a: switching gate electrode
124b: driving gate electrode 128: first storage capacitor plate
154a: switching semiconductor layer 154b: driving semiconductor layer
160: interlayer insulating layer 171: data line
173a: switching source electrode 173b: driving source electrode
175a: switching drain electrode 175b: driving drain electrode
178: storage capacitor plate 191: pixel electrode
191a: first layer 191b: second layer
191c: third layer
171a, 173a1, 175a1, 173b1, 175b1, 178a: lower layer
171b, 173a2, 175a2, 173b2, 175b2, 178b: intermediate layer
171c, 173a3, 175a3, 173b3, 175b3, 178c: upper layer Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic light emitting display device, comprising:
    a thin film transistor including a semiconductor layer, a gate electrode, and source and drain electrodes;
    a pixel electrode connected to the thin film transistor, the pixel electrode including:
        a first layer,
        a second layer disposed on the first layer and including silver, and
        a third layer including a carbon-based material and covering an upper portion and lateral surface of the second layer;

an organic emission layer including an organic light emitting member and disposed on the pixel electrode; and a common electrode disposed on the organic emission layer.

2. The organic light emitting display device as claimed in claim 1, wherein the first layer includes a carbon-based material.

3. The organic light emitting display device as claimed in claim 2, wherein the carbon-based material of the first layer and the third layer includes one or more of carbon nanotubes, carbon nanofibers, carbon black, graphene, fullerene, or graphite.

4. The organic light emitting display device as claimed in claim 2, wherein the first layer is connected to the drain electrode.

5. The organic light emitting display device as claimed in claim 1, wherein the first layer includes indium tin oxide.

6. The organic light emitting display device as claimed in claim 5, wherein at least one of the source and drain electrodes includes:

a lower layer including titanium or a carbon-based material;

an intermediate layer including aluminum; and an upper layer including a carbon-based material.

7. The organic light emitting display device as claimed in claim 6, wherein the upper layer covers an upper portion and lateral surface of the intermediate layer.

8. The organic light emitting display device as claimed in claim 7, wherein the carbon-based material includes one or more of carbon nanotubes, carbon nanofibers, carbon black, graphene, fullerene, or graphite.

9. The organic light emitting display device as claimed in claim 6, wherein the intermediate layer includes pure aluminum that is not alloy.

10. The organic light emitting display device as claimed in claim 6, wherein the intermediate layer includes aluminum alloy.

11. An organic light emitting display device, comprising:

a thin film transistor including a semiconductor layer, a gate electrode, and source and drain electrodes;

a pixel electrode connected to the thin film transistor and including a first layer, a second layer disposed on the first layer, and a third layer covering an upper portion and lateral surface of the second layer;

an organic emission layer disposed on the pixel electrode; and a common electrode disposed on the organic emission layer, wherein the lateral surface of the second layer is disposed at the outermost part of the second layer.

12. The organic light emitting display device as claimed in claim 11, wherein:

the first layer and the third layer include a carbon-based material; and the second layer includes silver.

13. The organic light emitting display device as claimed in claim 12, wherein the carbon-based material of the first layer and the third layer includes one or more of carbon nanotubes, carbon nanofibers, carbon black, graphene, fullerene, or graphite.

14. The organic light emitting display device as claimed in claim 11, wherein:

the first layer includes indium tin oxide;

the second layer includes silver; and the third layer includes a carbon-based material.

15. The organic light emitting display device as claimed in claim 14, wherein the carbon-based material of the third layer includes one or more of carbon nanotubes, carbon nanofibers, carbon black, graphene, fullerene, or graphite.

* * * * *